United States Patent [19]
Hirasawa

[11] 4,069,426
[45] Jan. 17, 1978

[54] COMPLEMENTARY MOS LOGIC CIRCUIT

[75] Inventor: Masataka Hirasawa, Yokohama, Japan

[73] Assignee: Tokyo Shibaura Electric Co., Ltd., Tokyo, Japan

[21] Appl. No.: 729,771

[22] Filed: Oct. 5, 1976

[30] Foreign Application Priority Data

Oct. 6, 1975 Japan .................................. 50-120486

[51] Int. Cl.² ..................... H03K 19/08; H03K 19/20; H03K 17/04; H03K 17/60
[52] U.S. Cl. .................................. 307/205; 307/207; 307/215; 307/218
[58] Field of Search ............... 307/203, 205, 207, 213, 307/215, 218, 251

[56] References Cited

U.S. PATENT DOCUMENTS

| | | | |
|---|---|---|---|
| 2,976,428 | 3/1961 | Parkhill et al. | 307/207 |
| 3,252,011 | 5/1966 | Zuk | 307/205 X |
| 3,579,119 | 5/1971 | Yau et al. | 307/207 X |
| 3,619,583 | 11/1971 | Arnold | 307/203 X |
| 3,720,841 | 3/1973 | Suzuki | 307/251 X |
| 3,737,673 | 6/1973 | Suzuki | 307/215 X |
| 3,912,914 | 10/1975 | Moylan | 307/207 X |
| 3,965,367 | 6/1976 | Mei | 307/205 X |

*Primary Examiner*—Larry N. Anagnos
*Attorney, Agent, or Firm*—Finnegan, Henderson, Farabow & Garrett

[57] ABSTRACT

A complementary MOS logic circuit for obtaining second logic signals corresponding to a large number of logic combinations derived from a group of first logic signals, wherein a plurality of series circuits each formed of a plurality of series-connected first channel type IG-FET's and a plurality of series circuits each formed of a plurality of series-connected second channel type IG-FET's are jointly connected to the output terminal of said complementary MOS type logic circuit; the gates of the first and second channel type IG-FET's are supplied with first logic signals and those complementary thereto to specify a desired block circuit consisting of the component series circuits formed of the first and second channel type IG-FET's; and a second logic signal is conducted to the output terminal through the specified block circuit.

8 Claims, 14 Drawing Figures

| STATE OF CONDITION | TRUTH VALUE OF FIRST LOGIC SIGNALS | | | SECOND LOGIC SIGNALS | OUTPUT SIGNALS $\overline{O}$ |
|---|---|---|---|---|---|
| | $I_1(1)$ | $I_1(2)$ | $I_1(3)$ | | |
| $S_0$ | 0 | 0 | 0 | $I_2(0)$ | $\overline{I_2(0)}$ |
| $S_1$ | 1 | 0 | 0 | $I_2(1)$ | $\overline{I_2(1)}$ |
| $S_2$ | 0 | 1 | 0 | $I_2(2)$ | $\overline{I_2(2)}$ |
| $S_3$ | 1 | 1 | 0 | $I_2(3)$ | $\overline{I_2(3)}$ |
| $S_4$ | 0 | 0 | 1 | $I_2(4)$ | $\overline{I_2(4)}$ |
| $S_5$ | 1 | 0 | 1 | $I_2(5)$ | $\overline{I_2(5)}$ |
| $S_6$ | 0 | 1 | 1 | $I_2(6)$ | $\overline{I_2(6)}$ |
| $S_7$ | 1 | 1 | 1 | $I_2(7)$ | $\overline{I_2(7)}$ |

COMPLEMENTARY MOS LOGIC CIRCUIT

This invention relates to a logic circuit adapted for integration, and more particularly to a complementary metal oxide semiconductor (abbreviated as "MOS") logic circuit formed of a plurality of insulated gate field effect transistors (abbreviated as "IG-FET's" or "MOS-FET's") of different channel types.

A complementary MOS logic circuit comprises a plurality of IG-FET's of two different channel types, that is, a plurality of N channel type IG-FET's and a plurality of P channel type IG-FET's. This complementary MOS logic circuit is characterized by small power consumption, quick operation and large noise margin and consequently adapted to provide an integrated digital circuit. However, this complementary MOS logic circuit has the following disadvantages since said circuit comprises complementary N channel type and P channel type IG-FET's, these IG-FET's of different channel types are arranged in a complicated pattern, with the resultant intricate form of wiring; IG-FET's have to be provided in a number substantially twice larger than those used in a signal channel type logic circuit, requiring a wider space for the IG-FET's and an enlarged integration chip; difficulties arise in designing an integrated circuit pattern and standardizing said pattern design; and said complementary MOS logic circuit is manufactured by a larger number of steps than the single channel type logic circuit, leading to higher production cost.

Figure 1:
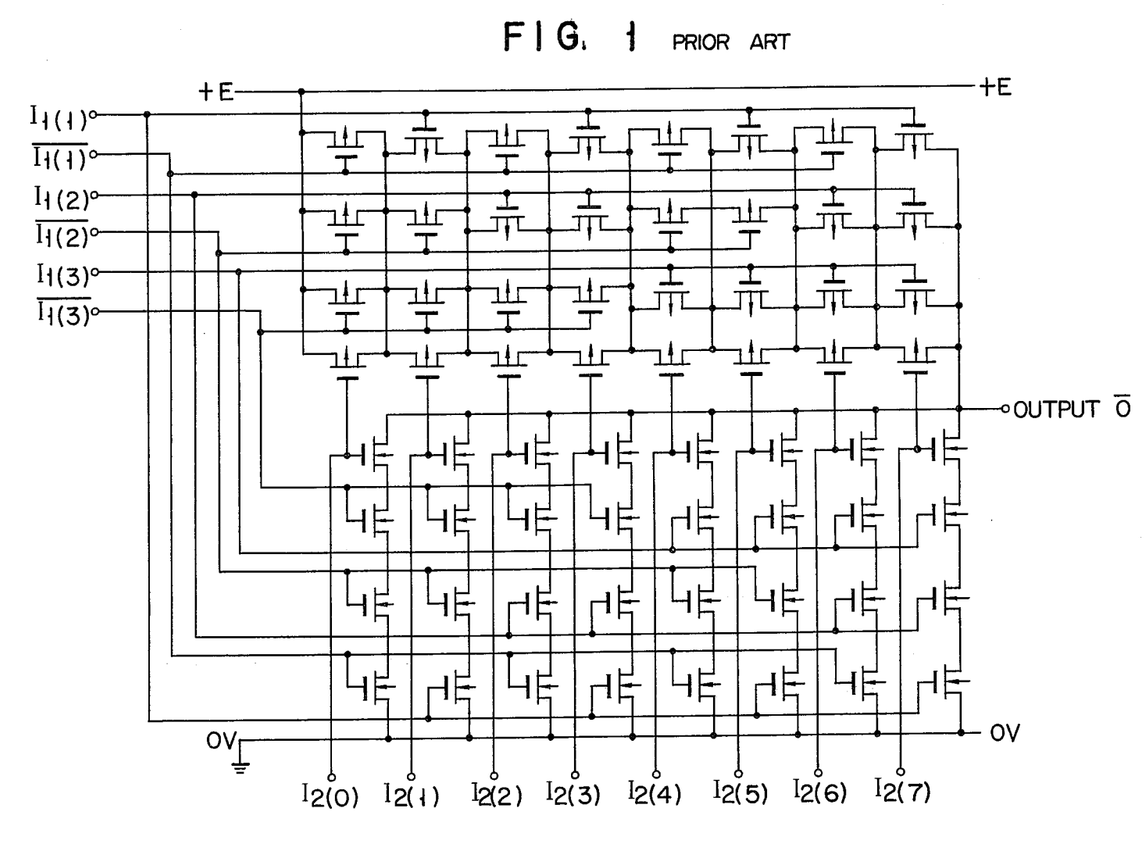
FIG. 1 illustrates the prior art complementary MOS logic circuit.

For application of a complementary MOS logic circuit accompanied with the above-mentioned drawbacks to large scale integration, therefore, it is necessary to decrease a chip space occupied by IG-FET's by using a smaller number of IG-FET's through improvement on circuit arrangement and elimination of the above-mentioned essential defects of said complementary MOS logic circuit. FIG. 1 illustrates a prior art complementary MOS logic circuit for obtaining second logic signals of a $2n$ number at maximum corresponding to a state of logic combinations of a $2n$ number at maximum derived from many first signals including those complementary thereto (with $n$ taken to be 3). This complementary circuit produces eight second logic signals $I_2(0)$ to $I_2(7)$ of negative polarity corresponding to eight states of logic combinations derived from first logic signals $I_1(1)$, $I_1(2)$, $I_1(3)$ (including those complementary thereto). In the complementary logic circuit of FIG. 1, N channel type FET's are connected in series with respect to an AND circuit and in parallel with respect to an OR circuit. P channel type FET's are connected in parallel with respect to the AND circuit and in series with respect to the OR circuit. In the case of the above-mentioned prior art complementary logic circuit shown in FIG. 1, series circuits of P channel type FET's are provided between a power supply line $+E$ and output terminal $\overline{O}$ in the same number as the AND circuits, that is, the aforesaid state of logic combinations, generally in a number of $2n$ (8 in FIG. 1) at maximum. With $n$ taken to be 4, 16 combinations are obtained, making it necessary to cause each block circuit to be formed of 16 series connected IG-FET's. Thus, series connected IG-FET's prominently increase in number as $n$ denotes a larger number. This means that it consumes much time fully to charge a parasitic capacity occurring at the output terminal with electric energy or fully discharge it from said parasitic capacity, resulting in the slow operation of the complementary logic circuit. Series connection of parallel circuits of IG-FET's to conductors (such as aluminum, molybdenum or polysilicone) arranged in parallel on a semiconductor substrate occupies a larger chip space than parallel connection of series circuits of IG-FET's to said conductors, presenting difficulties in integrating the complementary logic circuit of FIG. 1.

It is accordingly the object of this invention to provide a complementary MOS logic circuit which is operated quickly and is easily integrated due to a smaller chip space being required for IG-FET's.

According to an aspect of this invention, there is provided a complementary MOS logic circuit for obtaining second logic signals corresponding to the state of logic combinations derived from a group of first logic signals, which comprises a plurality of component series circuits each formed of a plurality of series-connected first channel type IG-FET's and a plurality of component series circuits each formed of a plurality of series-connected second channel type IG-FET's, wherein these component series circuits consisting of first and second channel type IG-FET'are jointly connected to the output terminal of said complementary MOS logic circuit; first logic signals or those complementary thereto are selectively supplied to the gates of the corresponding first channel type IG-FET's and the gates of the corresponding second channel type IG-FET's; the component series circuits formed of the first and second channel type IG-FET's are specified by the first logic signals or those complementary thereto; and a second logic signal is delivered to the output terminal of the complementary logic circuit through the specified component series circuit.

This invention can be more fully understood from the following detailed description when taken in conjunction with the accompanying drawings, in which.

There will now be described by reference to FIGS. 2 to 14 a complementary MOS logic circuit according to various embodiments of this invention. The complementary logic circuit of the invention obtains second logic signals $I_2(0)$ to $I_2(m-1)$ of a $2n$ number at maximum (where $m$ and $n$ are positive integers and $m$ denotes a number whose magnitude is expressed as $2 \leq n \leq 2n$) corresponding to logic combinations of a $2n$ number at maximum derived from a group of first logic signals $I_1(1)$ to $I_1(n)$. With $n$ taken to be 3, first logic signals supplied are $I_1(1)$, $I_1(2)$, $I_1(3)$ shown in FIG. 2 (including those complementary thereto) provide eight states of logic combinations $S_0$ to $S_7$. Eight second logic signals $I_2(0)$ to $I_2(7)$ corresponding to the states of said eight logic combinations are conducted to the output terminal $\overline{O}$ of the complementary logic circuit though AND circuits AND1 to AND8 and a NOR circuit. With this complementary logic circuit, each second logic signal is issued from the output terminal with a negative polarity. Further, three inverters $IN_1$ to $IN_3$ are provided to produce logic signals of negative polarity from the first logic signals $I_1(1)$ to $I_1(3)$.

Figure 3:
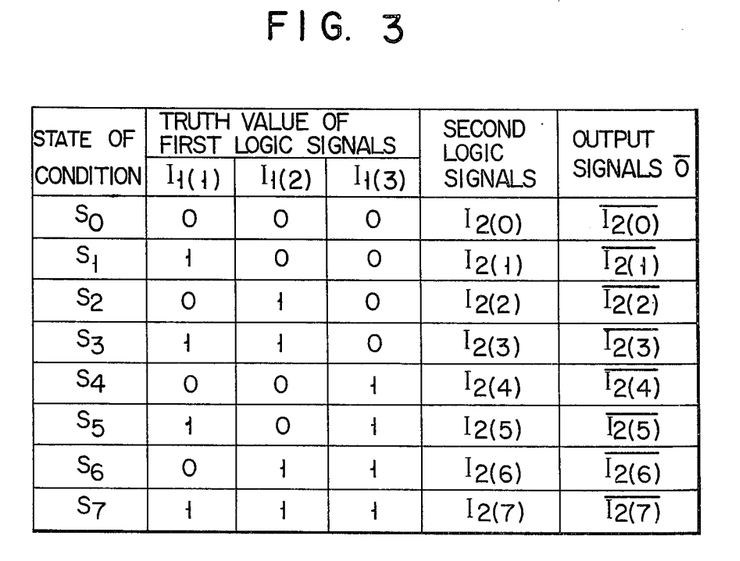
FIG. 3 is a truth table of the logic circuit of FIG. 2.

FIG. 3 is a truth table regarding the operation of the logic signals $I_1(1)$ to $I_1(3)$, second logic signals $I_2(1)$ to $I_2(7)$ and output signals $\overline{O}$ all corresponding to the states of eight logic combinations $S_0$ to $S_7$.

Figure 2:
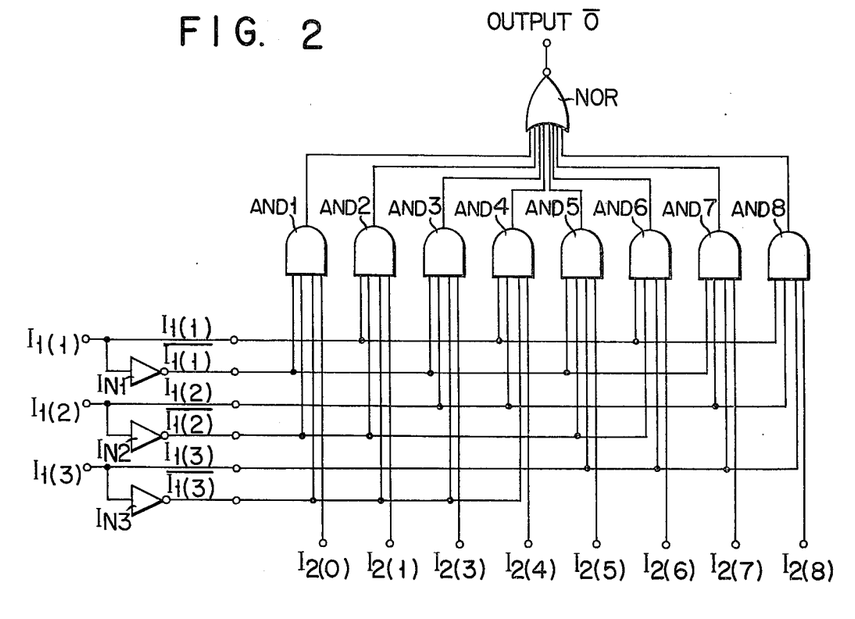
FIG. 2 is a logic chart of a logic circuit embodying this invention.
Figure 4:
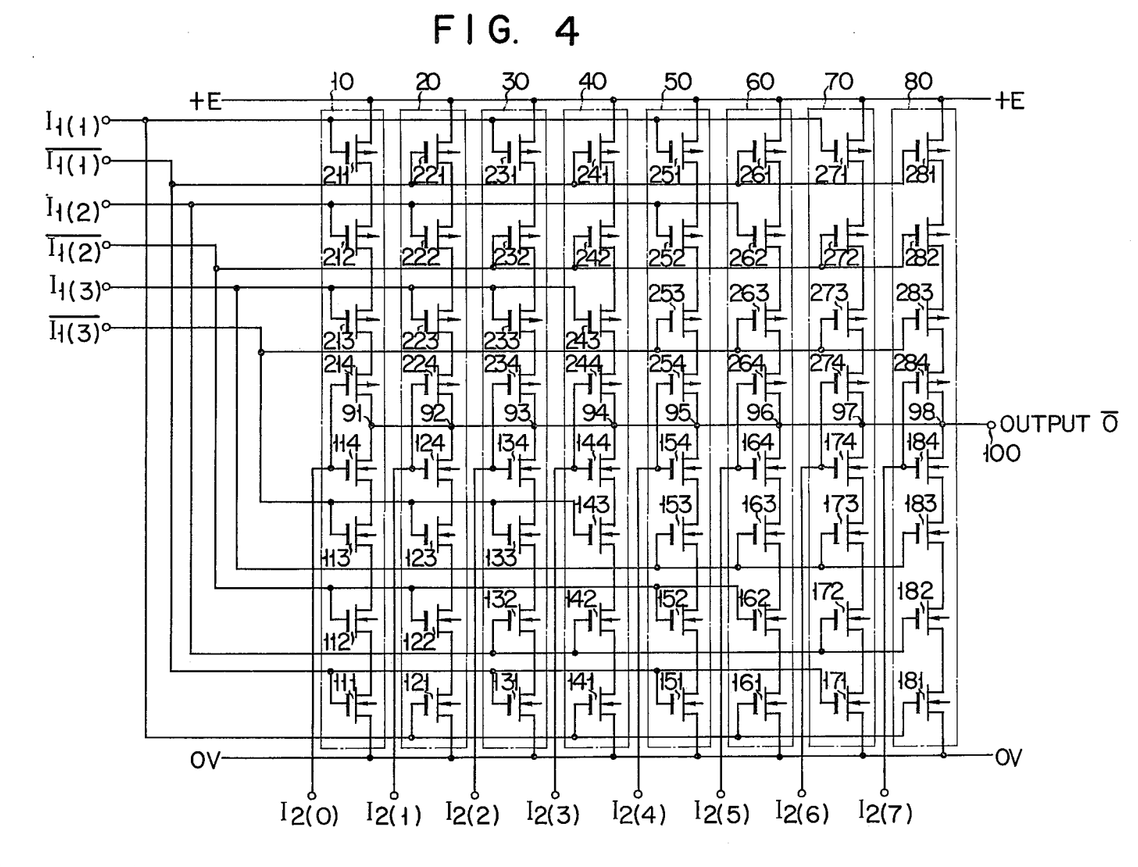
FIG. 4 shows a complementary MOS logic circuit according to a first embodiment of this invention using the logic circuit of FIG. 2.

FIG. 4 is a complementary MOS logic circuit according to a first embodiment of this invention using the logic circuit of FIG. 2. The first embodiment of FIG. 4 comprises a plurality of independent block series circuits provided between power supply lines $+E$ in a number corresponding to available logic combinations. Each of said block series circuits is formed of a component series of N channel type IG-FET's of an $n$ number at maximum whose gates are supplied with first logic signals of an $n$ number $I_1(1)$ to $I_1(n)$ or those complementary thereto; a component series circuit of P channel type IG-FET's of an $n$ number at maximum whose gates are supplied with first logic signals of an $n$ number $I_1(1)$ to $I_1(n)$ or those complementary thereto; and a pair of N channel type IG-FET and P channel type IG-FET complementary to each other which are disposed between the aforesaid groups of N and P channel type component series circuits and whose gates are supplied with second logic signals $I_2(0)$ to $I_2(m-1)$ corresponding to a state of combinations derived from the first logic signals of the $n$ number. The output terminals of said plural independent block series circuits are jointly connected. The states of the respective logic combinations are defined by the respective block series circuits, and the second logic signals $I_2(1)$ to $I_2(m-1)$ corresponding to said states of logic combinations are generated with negative polarity. Even where, therefore, the states of logic combinations increase in number, provision of a correspondingly large number of independent block series circuits enables a complementary MOS logic circuit to have a higher capacity. The various embodiments of this invention are described on the basis of the positive logic system by which the logic level of a higher power supply line, for example, $+E$ volts is taken to be "1", and the logic level of a lower power supply line of zero volt, for example, the grounding side is taken to be "0". This description also applies to the negative logic system.

FIG. 4 shows a complementary MOS logic circuit using the logic functions of FIG. 2 and 3. The first embodiment of FIG. 4 is different from the prior art complementary logic circuit in that the P channel type IG-FET's are connected in series instead of the parallel connection adopted in the prior art complementary circuit. The complementary MOS logic circuit of FIG. 4 is so described that with a number $n$ of first logic signals taken to be 3, eight second logic signals $I_2(0)$ to $I_2(7)$ corresponding to the eight states of logic combinations $S_0$ to $S_7$ derived from the logic levels of said three first logic signals are conducted to the output terminal 100 in an inverted form. IG-FET's used in the first embodiment of FIG. 4 are not connected to the substrate of the subject complementary logic circuit to avoid a complicated circuit arrangement. A block 10 of FIG. 4 comprises a pair of component series circuits of IG-FET's corresponding to the state of logic combination $S_0$ defined by the first logic signals $I_1(1)$, $I_1(2)$, $I_1(3)$ each having a logic level of "0", or logic signals $\overline{I_1(1)}$, $\overline{I_1(2)}$, $\overline{I_1(3)}$ complementary thereto each having a logic level of "1". The block 10 includes a component series circuit formed of N channel type IG-FET's 111, 112, 113, 114 and connected to the grounding point, and another component series circuit formed of P channel type IG-FET's 211, 212, 213, 214 and connected to the power supply line $+E$, both component series circuits being connected together at an output point 91. Similarly, the block 20, 30, 40, 50, 60, 70, 80 include component series circuits arranged in pairs and made to correspond to the other states of logic combinations $S_1$ to $S_7$. The N and P channel type IG-FET's constituting the blocks 20 to 80 are arranged in the same manner as in the block 10. Namely, the block 20 corresponding to the state of logic combination $S_1$ comprises a component series circuit formed of four N channel type IG-FET's 121, 122, 123, 124 and another component series circuit formed of four P channel type IG-FET's. The block 30 corresponding to the state of logic combination $S_2$ comprises a component series circuit formed of four N channel type IG-FET's 131, 132, 133, 134 and another component series circuit formed of four P channel type IG-FET's 231, 232, 233, 234.

The block 40 corresponding to the logic combination $S_3$ comprises a component series circuit formed of four N channel type IG-FET's 141, 142, 143, 144 and four P channel type IG-FET's 241, 242, 243, 244. The block 50 corresponding to the state of logic combination S₄ comprises a component series circuit formed of four N channel type IG-FET's 151, 152, 153, 154 and four P channel type IG-FET's 251, 252, 253, 254. The block 60 corresponding to the state of logic combination S₅ comprises a component series circuit formed of four N channel IG-FET's 161, 162, 163, 164 and four P channel type IG-FET's 261, 262, 263, 264. The block 70 corresponding to the state of logic combination S₆ comprises a component series circuit formed of four N channel type IG-FET's 171, 172, 173, 174 and four P channel type IG-FET's 271, 272, 273, 274. The block 80 corresponding to the state of logic combination S₇ comprises a component series circuit formed of four N channel type IG-FET's 181, 182, 183, 184 and four P channel type IG-FET's 281, 282, 283, 284. The output points 91 to 98 of the blocks 10 to 80 are jointly connected to the output terminal 100. Then it will be seen that the blocks 10 to 80 correspond to the AND circuits AND1 to AND8 of FIG. 2. Throughout this specification, the parts of other figures than FIGS. 2, 3 and 4 the same as those of said FIGS. 2, 3 and 4 are denoted by the same numerals.

There will now be described the operation of the complementary MOS logic circuit of FIG. 4. Now let it be assumed that the logic combination S₃ is specified by the first logic signal $I_1(1)$ of "1", $I_1(2)$ of "1" and $I_1(3)$ of "0" as shown in the truth table of FIG. 3. Then, first logic signals $I_1(1)$, $I_1(2)$ and $\overline{I_1(3)}$ are supplied to the gates of the N channel type IG-FET's 141 to 144 included in the block 40. Namely, the gate of the IG-FET 141 is supplied with the logic signal $I_1(1)$, the gate of the IG-FET 142 with the logic signal $I_1(2)$ and the gate of the IG-FET 143 with the logic signal $\overline{I_1(3)}$. On the other hand, the gates of the P channel type IG-FET's 241 to 244 included in the block 40 are respectively supplied with signals $\overline{I_1(1)}$, $\overline{I_1(2)}$, $I_1(3)$ complementary to the aforesaid first logic signals $I_1(1)$, $I_1(2)$, $\overline{I_1(3)}$. A second logic signal $I_2(3)$ produced in the case of the state of logic combination S₃ is conducted to the gate of one (144) of the four N channel type IG-FET's included in the block 40 and also to the gate of one (244) of the four P channel type IG-FET's included in the block 40.

Where the logic combinations S₃ is specified, the first logic signals $I_1(1)$, $I_1(2)$ have a logic level of "1" and the first logic signal $I_1(3)$ has a logic level of "0", allowing the N channel type IG-FET's 141 to 143 and the P channel type IG-FET's 241 to 243 to be rendered conducting. At this time, the N channel type IG-FET's 113, 121, 123, 132, 133, 161, 172, 181, 182 and P channel type IG-FET's 213, 221, 223, 232, 233, 261, 272, 281, 282 of all the other blocks are operated, whereas the N channel type IG-FET's 111, 112, 122, 131, 151, 152, 153, 162, 163, 171, 173, 183 and the P channel type IG-FET's 211, 212, 222, 231, 251, 252, 253, 262, 263, 271, 273, 283 of all the other blocks are rendered nonconducting. Namely, where the state of logic combination S₃ is specified, the IG-FET's constituting the block 40 whose gates are supplied with the first logic signals $I_1(1)$, $I_1(2)$, $\overline{I_1(3)}$ and signals inverted therefrom are all turned on. On the other hand, at least one of the N channel type IG-FET's of the other blocks whose gates are supplied with logic signals $\overline{I_1(1)}$, $\overline{I_1(2)}$, $I_1(3)$ and at least one of the P channel type IG-FET's of all the other blocks whose gates are supplied with signals inverted from the logic signals $\overline{I_1(1)}$, $\overline{I_1(2)}$, $I_1(3)$ are rendered nonconducting. Where, therefore, the state of logic combination S₃ is specified, no current passes between the output point and the ground or between the output point and power supply line +E with respect to the other blocks than the block 40. Consequently, current flows to the output terminal 100 only in the block 40, which becomes equivalent to an inverter circuit formed of IG-FET's 144, 244. When an output signal from the subject complementary MOS logic circuit is specified by the second logic signal $I_2(3)$, then said second logic signal $I_2(3)$ is inverted by the aforesaid equivalent inverter formed of the IG-FET's 144, 244. As the result, an inverted output signal, $\overline{I_2(3)}$, is sent forth from the ouput terminal 100.

As described above, the complementary MOS logic circuit of FIGS. 2, 3, 4 uses first logic signals whose number $n$ is taken to be 3. A logic formula $O_N$ relative to an N channel type IG-FET and a logic formula $O_P$ relative to a P channel type IG-FET may generally be expressed as follows:

$$O_P = \prod_{i=1}^{M} (I_2(i-1) + \overline{S(i-1)})$$

In case of negative logic $$O_N = \prod_{i=1}^{M} (I_2(i-1) + \overline{S(i-1)})$$

$$O_P = \sum_{i=1}^{M} (I_2(i-1) \cdot S(i-1))$$

With M taken to be $\leq 2n$, both of the above equations denote that a plurality of component series circuits each formed of a plurality of N channel type IG-FET's or a plurality of P channel type IG-FET's are connected in parallel. With the complementary MOS logic circuit of FIG. 4, four P channel IG-FET's constitute a component series circuit included in each block with $n$ denoting the number of first logic signals, taken to be 3. When the $n$ is taken to be 4, said component series circuit is formed of five P channel type IG-FET's, showing an increase of only one unit. Conversely, with the prior art complementary MOS type logic circuit, eight P channel type IG-FET's constitute a component series circuit included in each block. In the case where $n$ is taken to be 4, sixteen P channel type IG-FET's form a component series circuit included in each block showing a prominent increase in the number of units. An increase in a number of IG-FET's constituting a component series circuit results in the slow operation of a complementary MOS logic circuit.

As is apparent from the foregoing description, a complementary MOS logic circuit embodying this invention can be operated faster than that of the prior art. The operating speed of a complementary MOS logic circuit is related to the space of a chip occupied by said circuit. Numerically expressed, the complementary MOS logic circuit of this invention is operated about 1.3 times faster than that of the prior art with the $n$ taken to be 3 and about 3 times faster with $n$ taken to be 4. With the complementary MOS logic circuit of this invention shown in FIG. 4, the component series circuits of P channel type IG-FET's of all the blocks are connected in parallel whereas, with the prior art complementary MOS logic circuit of FIG. 1, the component parallel circuits of P channel type IG-FET's of all the blocks are connected in series.

Generally, integration of parallel circuits of IG-FET's requires a large chip space, whereas integration of series circuits of IG-FET's only needs a relatively small chip space. Therefore, the complementary MOS logic circuit of this invention, when integrated, occupies as small a chip space as about ¾ to ½ of that which is required for the prior art complementary MOS logic circuit.

Figure 5:
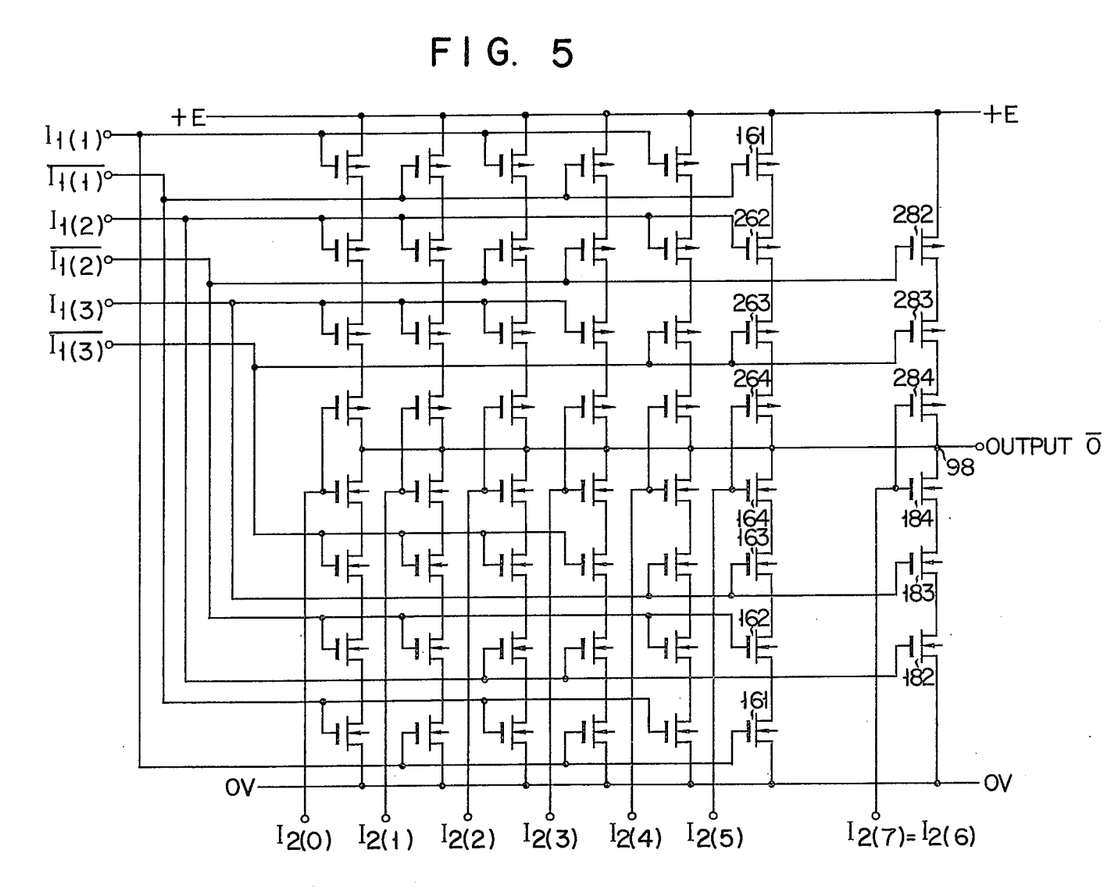
FIG. 5 indicates a complementary MOS logic circuit according to a second embodiment of the invention where the logic signals $I_2(6)$ and $I_2(7)$ of FIG. 2 are equivalent to each other.

There will now be described by reference to FIG. 5 a complementary MOS logic circuit according to a second embodiment of this invention.

Where the gates of some of the IG-FET's constituting a complementary MOS logic circuit are supplied with logic signals of the same form, the second embodiment of FIG. 5 is designed to decrease a required number of IG-FET's either by connecting together the source electrodes of IG-FET's of the same channel type whose gates are supplied with logic signals of the same form, or by substituting those plural IG-FET's by a single unit. For example, where second logic signals $I_2(6)$ and $I_2(7)$ included in the eight second logic signals $I_2(0)$ to $I_2(7)$ corresponding to the eight states of logic combinations $S_0$ to $S_7$ are of the same form, then it is possible to connect together the source electrodes of N channel type IG-FET's 174, 184 of the complementary MOS logic circuit of FIG. 4 or omit one of said IG-FET's 174, 184. This is also the case with the P channel type IG-FET's 274, 284. Further, input signals supplied to the gates of IG-FET's 173, 183, those to the gates of IG-FET's 172, 182, those to IG-FET's 273, 283 and those to IG-FET's 272, 282 are respectively of the same form. Therefore, it is possible to connect together the source electrode of the respective pairs of IG-FET's or omit one unit from each pair of said IG-FET's.

With the complementary MOS logic circuit of FIG. 4, complementary logic signals $I_1(1)$, $\overline{I_1(1)}$ are supplied to the gates of parallel connected IG-FET's 171, 181, either of which is therefore always rendered conducting. If the source of IG-FET 182 is directly grounded, then said IG-FET's 171, 181 can be omitted. The gates of IG-FET's 271, 281 are also supplied with complementary signals. If, therefore, the source electrode of IG-FET 282 is connected to the power supply line $+E$, then said IG-FET's can be omitted.

FIG. 5 shows a complementary MOS logic circuit wherein second logic signals are of the same form, namely, the case where the number of IG-FET's used in the embodiment of FIG. 4 can be decreased by application of the above-mentioned process. With the embodiment of FIG. 5, one unit is omitted from each pair of IG-FET's of the same channel type whose gates are supplied with signals of the same form, and further IG-FET's 271, 281, 171, 181 are eliminated. The block series circuits 70 and 80 corresponding to the state of logic combination $S_6$ and $S_7$ comprise the same component series circuit formed on N channel type IG-FET's 182, 183, 184 and the same component series circuit formed of P channel type IG-FET's 282, 283, 284. Therefore the embodiment of FIG. 5 uses, for example, the block 80 corresponding to the state of logic combination $S_7$, omitting the block 70 corresponding to the state of logic combination $S_6$. Where some of the logic signals supplied to a complementary MOS logic circuit are of the same form, then the embodiment of FIG. 5 considerably decreases a required number of IG-FET's and in consequence the cost of manufacturing said logic circuit.

There will now be described by reference to FIG. 6 a complementary MOS type logic circuit according to a third embodiment of this invention. Where some of the second logic signals supplied to a complementary MOS logic circuit are chosen to have a specified logic level "0" or "1", then the third embodiment of FIG. 6 can decrease a required number of IG-FET's and in consequence a chip space occupied by said IG-FET's according to the number of second logic signals having said specified logic level. For example, where some of the second logic signals $I_2(0)$ to $I_2(7)$ supplied to the logic circuit of FIG. 2 are chosen to have a logic level of "0" or "1", then an AND circuit whose gate is supplied with a signal of "0" produces an output having a logic level of "0" and consequently can be omitted. An output from an AND circuit whose gate is supplied with a signal of "1" has its logic level governed by that of an input signal supplied to any other AND circuit. Therefore, the input signal of "1" supplied to the first mentioned AND circuit can be omitted. Assuming that a second logic signal $I_2(6)$ has a logic level of "0" and a second logic signal $I_2(7)$ has a logic level "1", then the AND circuit AND7 of FIG. 2 can be omitted and a second logic signal $I_2(7)$ supplied to an AND circuit AND8 can be omitted.

Figure 6:
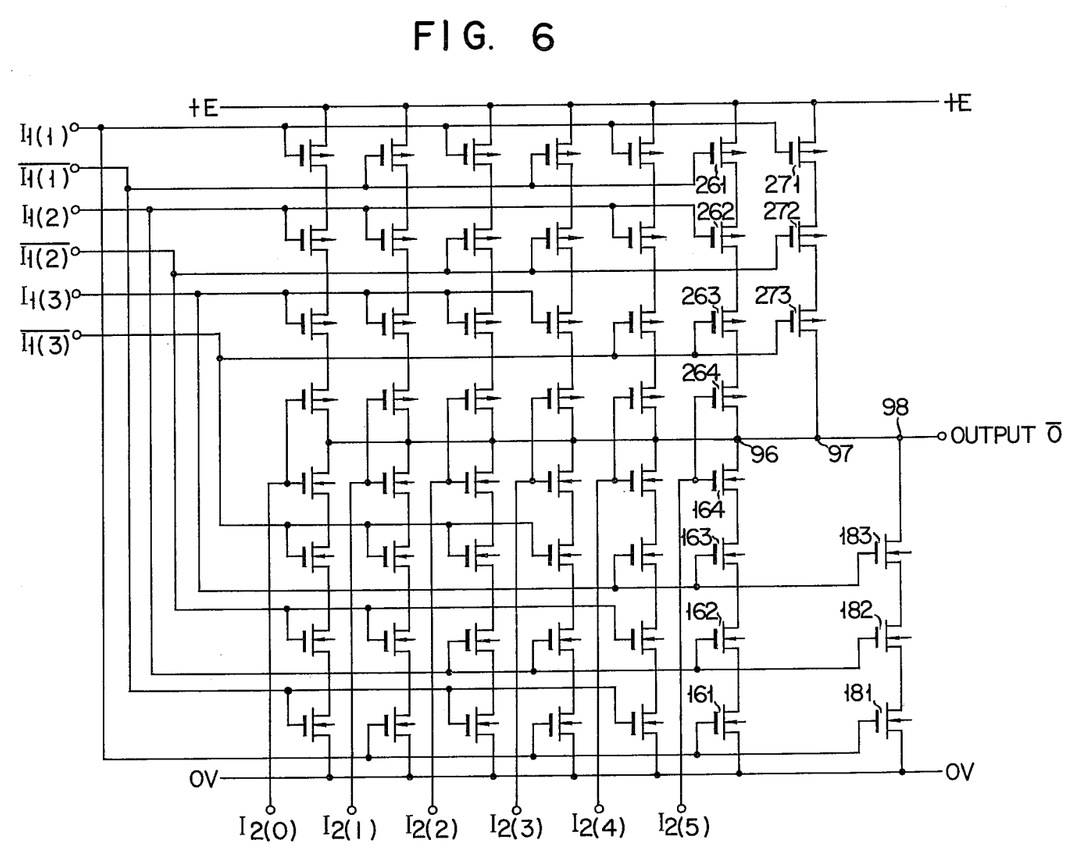
FIG. 6 is a complementary MOS logic circuit according to a third embodiment of the invention, where the logic signal $I_2(6)$ of FIG. 2 denotes a logic level "0" and the logic signal $I_2(7)$ thereof shows a logic level of "1"

The third embodiment of FIG. 6 represents the case where the condition of $I_2(6) =$ "0" and $I_2(1) = 1$ is applied to the complementary MOS logic circuit of FIG. 4. Under this condition, the N channel type IG-FET 174 of FIG. 4 whose gate is supplied with a second logic signal $I_2(6)$ of "0" is always rendered inoperative, while the P channel type IG-FET 274 of FIG. 4 whose gate is supplied with said second logic signal $I_2(6)$ of "0" is always rendered conducting. Therefore, the N channel type IG-FET's 171 to 174 of the block series circuit 70 corresponding to the state of logic combination $S_6$ are not required, making it unnecessary to provide a component series circuit formed of said N channel type IG-FET's 171 to 174 between the output point 97 and the ground denoted by a line OV. It is possible to omit P channel type IG-FET 274 from the component series circuit of said block 70 formed of P channel type IG-FET's and connect the component series circuit formed of IG-FET's 271, 272, 273 between the output point 97 and power supply line $+E$. Similarly, P channel type FET 184 whose gate is supplied with a second logic signal $I_2(7)$ having a logic level of "1" is always rendered conducting, while P channel IG-FET 284 whose gate is supplied with said second logic signal $I_2(7)$ having a logic level of "1" is always rendered inoperative. Therefore, P channel type IG-FET's 281 to 284 can be omitted from the block series circuit 80 corresponding to the state of logic combination $S_7$ making it unnecessary to connect a component series circuit formed of said P-channel type IG-FET's 281 to 284. It is possible to omit N channel type IG-FET 184 from a component series circuit formed of N channel type IG-FET's and connect the component series circuit formed of N-channel type IG-FET's 181, 182, 183 between the output point 98 and the ground. The logic circuit of FIG. 6 simplifies the arrangement of the complementary MOS logic circuit of FIG. 4.

Figure 7:
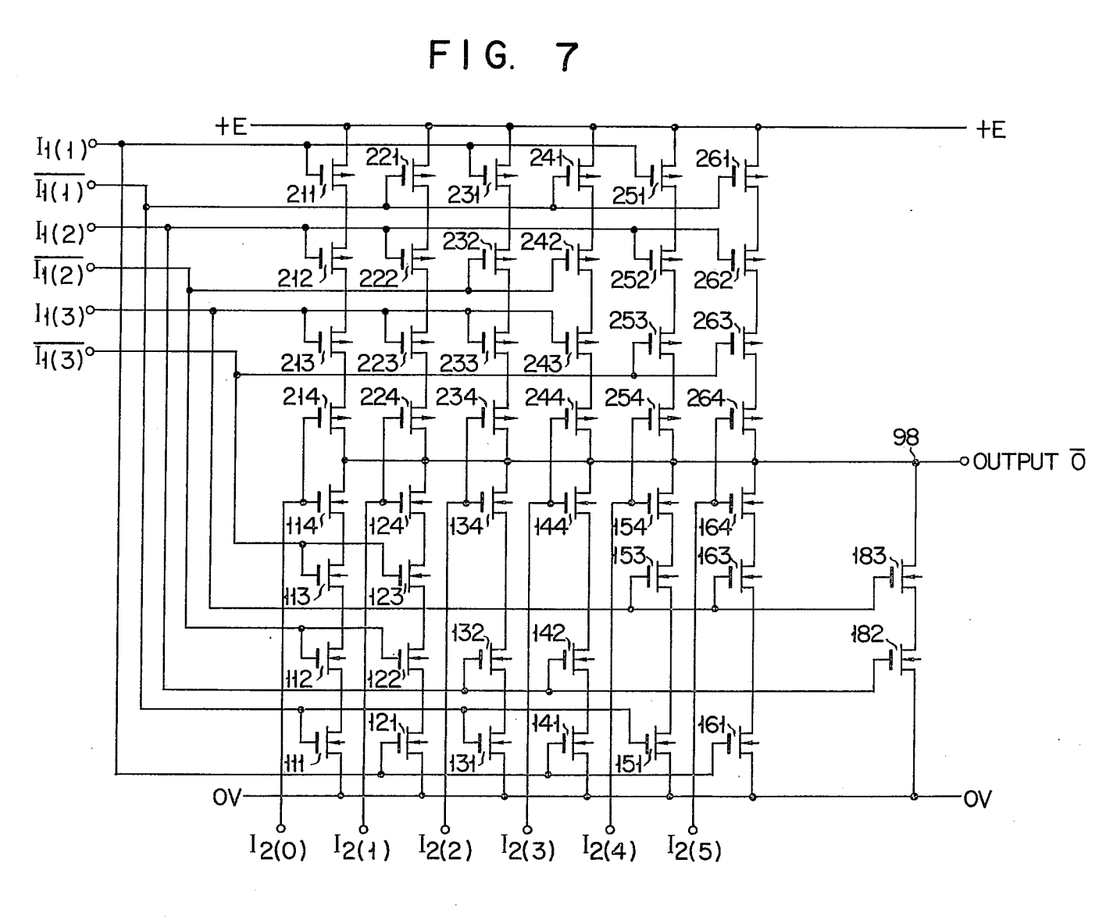
FIG. 7 presents a complementary MOS logic circuit according to a fourth embodiment of the invention, where both logic signals $I_2(6)$ and $I_2(7)$ of FIG. 2 have a logic level of "1"

A fourth embodiment of FIG. 7 represents a complementary MOS logic circuit wherein second logic signals $I_2(6)$ and $I_2(7)$ included in those supplied to said circuit have a logic level of "1" alike. Application of the above-mentioned condition of $I_2(6) =$ "1" and $I_2(7) =$ "1" to the logic circuit of FIG. 2 provides a logic circuit shown in FIG. 8. Namely, one of the AND circuits AND7, AND8 of FIG. 2, for example AND7 can be omitted. Since the second logic signals $I_2(6)$, $I_2(7)$ always have a logic level of "1", P channel type IG-FET's corresponding to those second logic signals are always rendered inoperative, while N channel type IG-FET's corresponding to said second logic signals are always rendered conducting. Therefore, second logic signals I₂(6), I₂(7) become unnecessary, making it possible to omit said second logic signals $I_2(6)$, $I_2(7)$ from a complementary MOS logic circuit.

Figure 8:
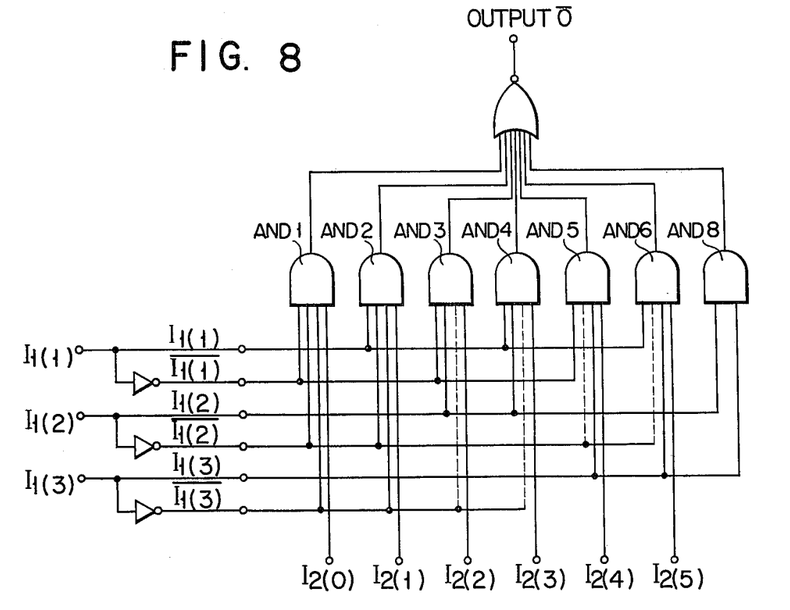
FIG. 8 is a logic chart of the logic circuit of FIG. 7.

It is also possible to eliminate those portions of a complementary MOS logic circuit which correspond to first logic signals $\overline{I_1(2)}$, $\overline{I_1(3)}$ (shown in dotted lines in FIG. 8) supplied to the AND circuits AND 3 to AND6 of FIG. 8. Where the above-mentioned process is applied to the complementary MOS logic circuit of FIG. 4, it is possible to omit the block series circuit 70 formed of N channel type IG-FET's 171 to 174 and P channel type IG-FET's 271 to 274. Further, it is possible to omit other IG-FET's of the block series circuit 80 corresponding to the AND circuit AND8 of FIG. 8 than the N channel type IG-FET's which are supplied with first logic signals $I_1(2)$, $I_1(3)$ respectively. As the result, only N channel type IG-FET's 182, 183 of the block series circuit 80 are connected in series between the output point 98 and the ground OV. It is possible to omit N channel type IG-FET's 133, 143, 152, 162 corresponding to first logic signals $\overline{I_1(3)}$, $\overline{I_1(2)}$ (shown in dotted lines in FIG. 8) supplied to the AND circuits AND3 to AND6 of FIG. 8. However, it is impossible to omit the P channel type IG-FET's whose gates are supplied with signals complementary to the first logic signals shown in dotted line from the component series circuit of P channel type IG-FET's corresponding to the component series circuit of N channel type IG-FET's.

Figure 9:
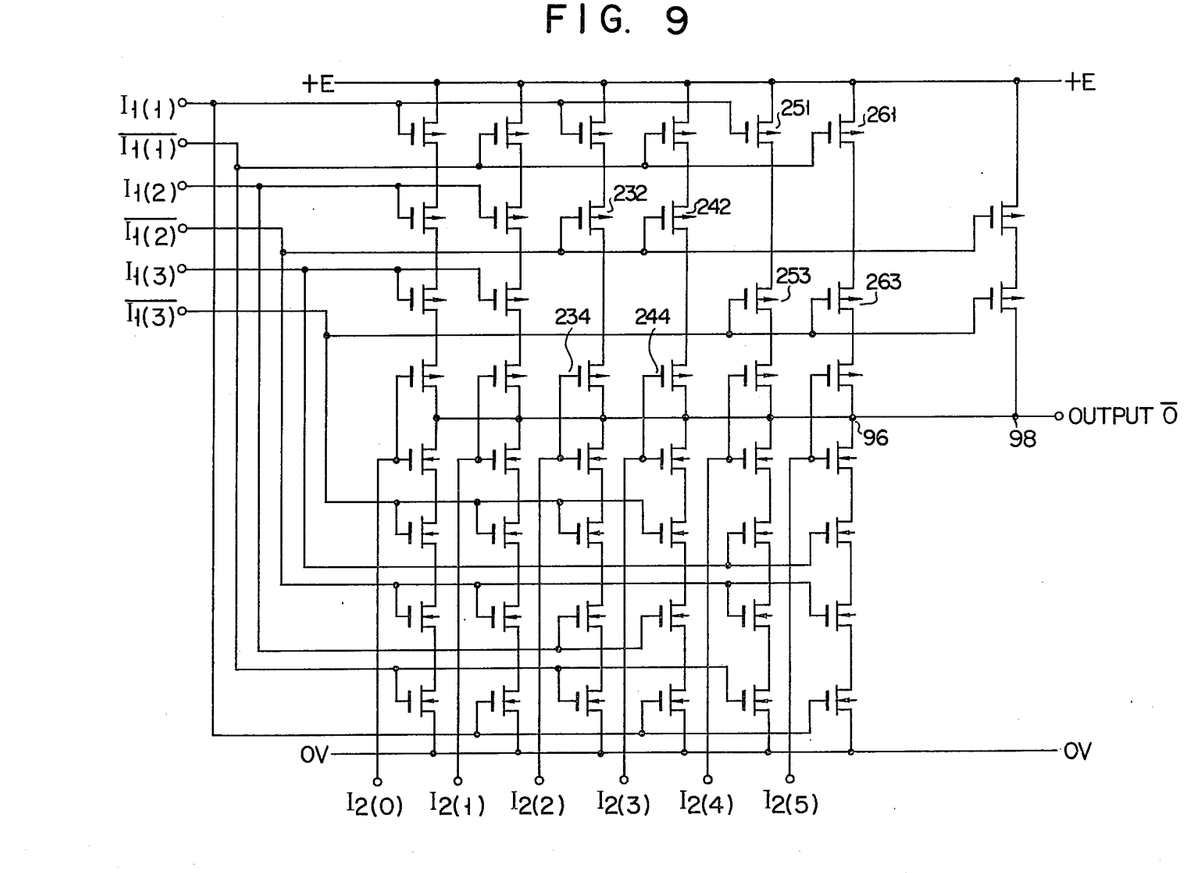
FIG. 9 sets forh a complementary MOS logic circuit according to a fifth embodiment of the invention, whose both logic signals $I_2(6)$ and $I_2(7)$ of FIG. 2 have a logic level of "0"
Figure 10:
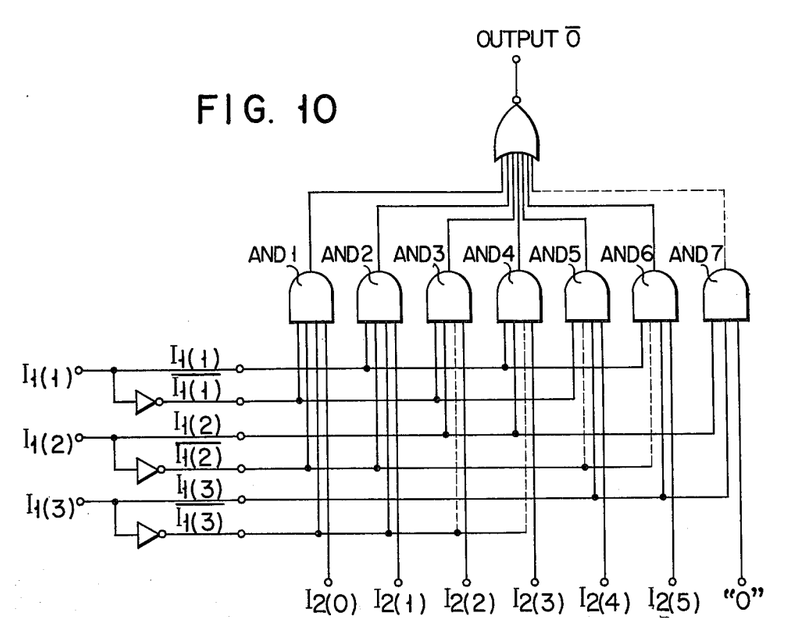
FIG. 10 is a logic chart of the logic circuit of FIG. 9.

FIG. 9 shows a complementary MOS logic circuit wherein second logic signals $I_2(6)$, $I_2(7)$ included in those supplied to said circuit have a logic level of "0" alike. Since the second logic signals $I_2(6)$, $I_2(7)$ always have a logic level of "O", P channel type IG-FET's corresponding to these second logic signals are always rendered conducting, while N channel type IG-FET's supplied with said second logic signals always become inoperative. Therefore, the second logic signals $I_2(6)$, $I_2(7)$ are unnecessary, making it possible to omit the AND circuits AND7, AND8 of FIG. 2. Though it is possible to eliminate P channel type IG-FET's supplied with first logic signals $I_1(2)$, $I_1(3)$ complementary to first logic signals $\overline{I_1(2)}$, $\overline{I_1(3)}$ (shown in dotted lines) supplied to the AND circuits AND3 to AND6 of FIG. 8, yet it is impossible to omit P channel type IG-FET's corresponding to said first logic signals $\overline{I_1(2)}$, $\overline{I_1(3)}$ supplied to the AND circuit AND8. Namely, the block series circuit 70 of the first embodiment (FIG. 4) corresponding to the AND circuit AND7 of FIG. 2 can be omitted. It is also possible to eliminate P channel type IG-FET's 232, 242, 251, 261 corresponding to complementary signals $I_1(2)$, $I_1(3)$ (shown in dotted lines in FIG. 8) supplied to the AND circuits AND3 to AND6 of FIG. 8. The block series circuit of FIG. 9 which corresponds to the AND circuit AND8 of FIG. 2 has only to be formed of two P channel type IG-FET's 282, 283 connected in series between the output point 98 and the power supply line +E.

Figure 11:
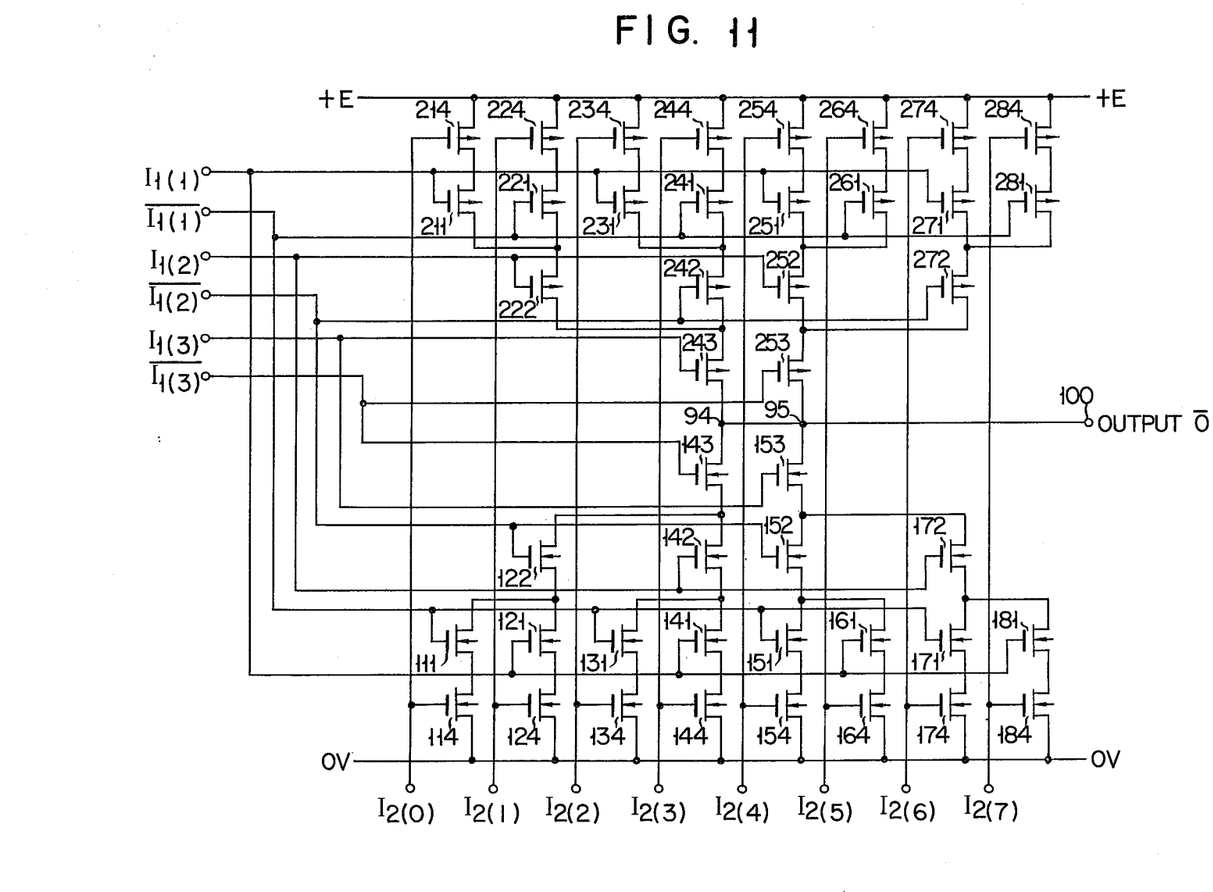
FIG. 11 shows a complementary MOS logic circuit according to a sixth embodiment of the invention, where unnecessary ones are omitted from a group of interchangeably usable IG-FET's of FIG. 4, thereby arranging IG-FET's in the form of two triangles with the apical portions made to face each other.

There will now be described by reference to FIG. 11 a sixth embodiment of this invention. The arrangement of this sixth embodiment is provided, for example, by disposing the N channel IG-FET's 114, 124, 134, 144, 154, 164, 174, 184 of the respective blocks series circuits of FIG. 4 on the ground side OV and the P channel IG-FET's 214, 224, 234, 244, 254, 264, 274, 284 on the side of the power supply line +E, and eliminating the unnecessary ones (N channel type IG-FET's 112, 113, 123, 132, 162, 163, 173, 182, 183 and P channel type IG-FET's 212, 213, 223, 232, 233, 262, 263, 273, 282, 283) of the interchangeably usable IG-FET's. Therefore, the sixth embodiment of FIG. 11 can decrease a required number of IG-FET's and in consequence that of output lines. With the sixth embodiment of FIG. 11, IG-FET's are arranged in the form of two triangles whose apical portions are made to face each other, that is, whose bases lie on the side of the power supply line +E and the side of the ground OV respectively. The sixth embodiment of FIG. 11 has the advantages that since only a small number (4 indicated) of IG-FET's are connected to the output terminal 100, said output terminal is allowed to have a small parasitic capacity, enabling the complementary MOS logic circuit to be operated quickly; a required number of IG-FET's can be prominently decreased; and where output gates and wiring are made of different materials, namely, the output gates are formed of, for example, silicon, or molybdenum and wiring is made of aluminum, then said logic circuit can be easily manufactured.

Figure 12:
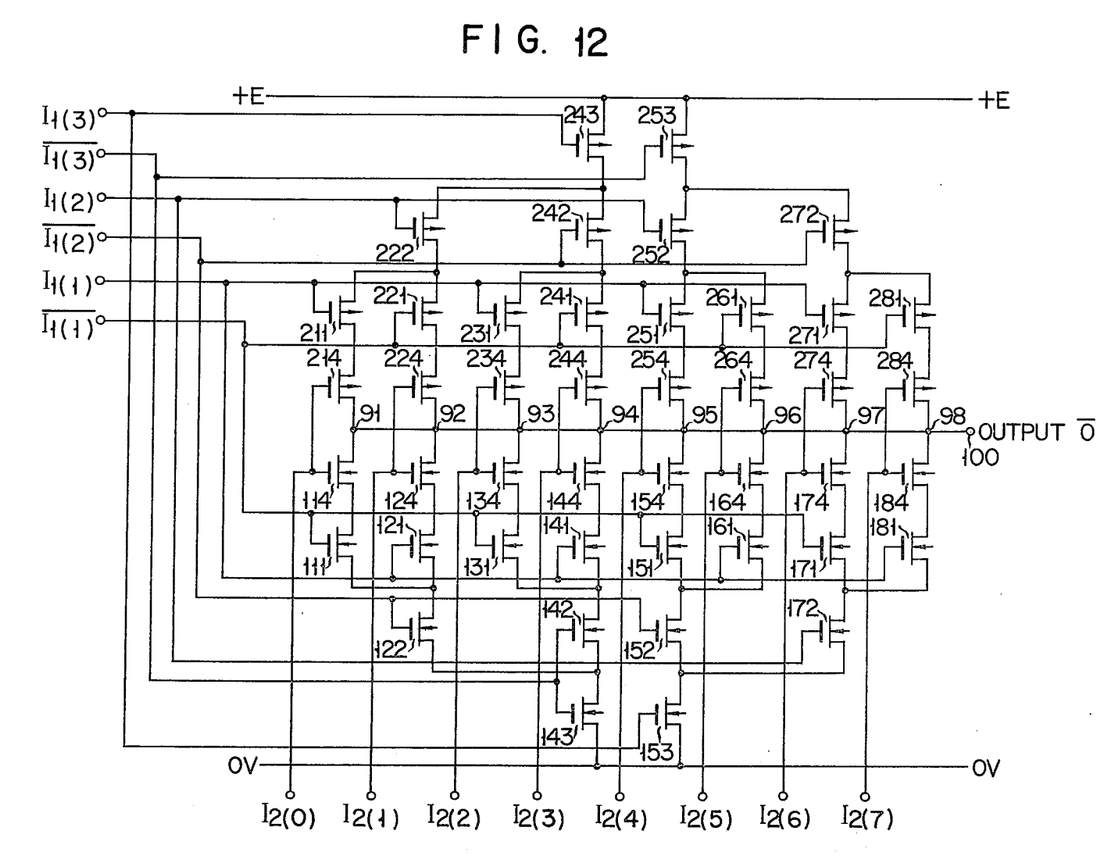
FIG. 12 illustrates a complementary MOS logic circuit according to a seventh embodiment of the invention, where the first logic signals of said complementary logic circuit are arranged in a reverse order from those of FIG. 7 and unnecessary ones are omitted from a group of interchangeably usable IG-FET's of FIG. 4, thereby arranging IG-FET's in the form of two triangles with the base portions made to face each other.

There will now be described by reference to FIG. 12 a sevent embodiment of this invention. With this embodiment, the first logic signals $I_1(1)$, $I_1(2)$, $I_1(3)$ are arranged in an order reversed from FIG. 4, IG-FET's are provided in the form of two triangles whose apical portion lie on the side of the power supply line +E and the side of the ground respectively, and whose base planes lie on the side of the output point to face each other. Though differing from the sixth embodiment of FIG. 11 with respect to the arrangement of IG-FET's the embodiment of FIG. 12 can considerably decrease a required number of IG-FET's like that of FIG. 11.

Figure 13:
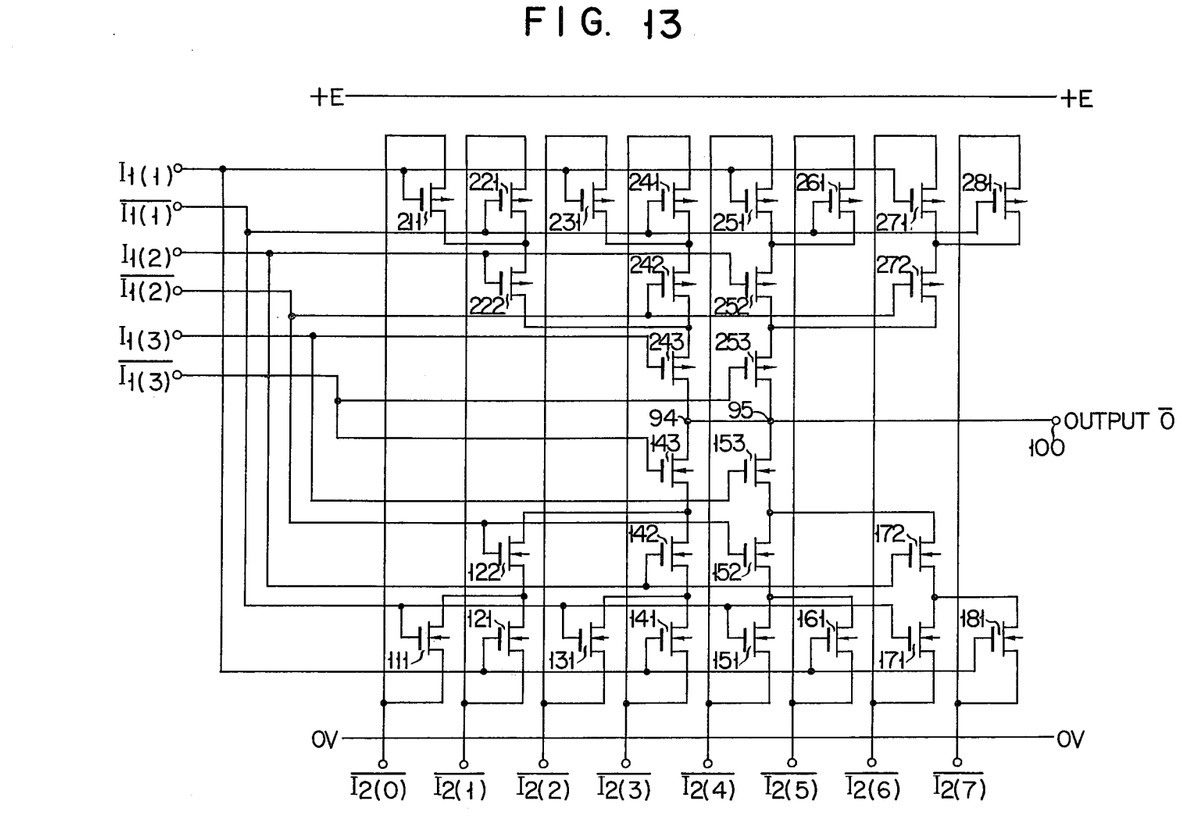
FIG. 13 indicates a complementary MOS logic circuit according to an eighth embodiment of the invention, where, as in FIG. 11, unnecessary ones are omitted from a group of interchangeably usable IG-FET's of FIG. 4, thereby arranging IG-FET's in the form of two triangles with the apical portions made to face each other, and logic signals are supplied from the source side of IG-FET's.

There will now be described by reference FIG. 13 an eighth embodiment of this invention. With this embodiment, second logic signals are supplied to that side (source side) of the component series circuit of each block formed of N channel type IG-FET's which is opposite to the output terminal of said component series circuit and also the source side of the component series circuit of each block formed of P channel type IG-FET's which is opposite to the output terminal of said component series circuit. While, in the first embodiment of FIG. 4, second logic signals are supplied to the gates of IG-FET's, said second logic signals are supplied to the sources of IG-FET's in the embodiment of FIG. 13. When one block series circuit of the complementary MOS logic circuit of, for example, FIG. 4 is specified, the other block series circuits are not designated. Therefore, it is possible to omit N and P channel type IG-FET's constituting inverters, that is 114-214, 124-224, 134-234, 144-244, 154-254, 164-264, 174-274, 184-284, thereby enabling second logic signals $I_2(0)$ to $I_2(7)$ to be supplied to those sides of the paired N and P channel type component series circuits of the corresponding blocks which are disposed opposite to the output terminals of said component series circuits. FIG. 13 is modified from FIG. 11 by applying the above-mentioned fact. With the embodiment of FIG. 13, second logic signals $I_2(0)$ to $I_2(7)$ supplied to one end (source electrode) of the respective block series circuits are conducted to the output terminal 100 with the same polarity as that which said second logic signals were initially supplied to the complementary MOS logic circuit. To have the same function as the complementary MOS logic circuit of FIG. 4, therefore, the eighth embodiment of FIG. 13 is supplied with second logic signals $\overline{I_2(0)}$ to $\overline{I_2(7)}$ complementary to second logic signals $I_2(0)$ to $I_2(7)$.

There will now be described the process by which the complementary second logic signal $\overline{I_2(0)}$ is conducted to the output terminal 100. Said second logic signal $\overline{I_2(0)}$, if having the same logic voltage level of "0" as ground, passes chiefly through N channel type IG-FET's 111, 122, 143 and output point 94 to the output terminal 100. If having the same logic voltage level of "1" as the power supply line +E, the second logic signal $\overline{I_2(0)}$ passes chiefly through P channel type IG-FET's 211, 222, 243 and output point 94 to the output terminal 100. As compared with FIG. 4, the eighth embodiment of FIG. 13 can more prominently decrease a required number of IG-FET's and in consequence a chip space occupied by IG-FET's, thus reducing manufacturing cost.

Figure 14:
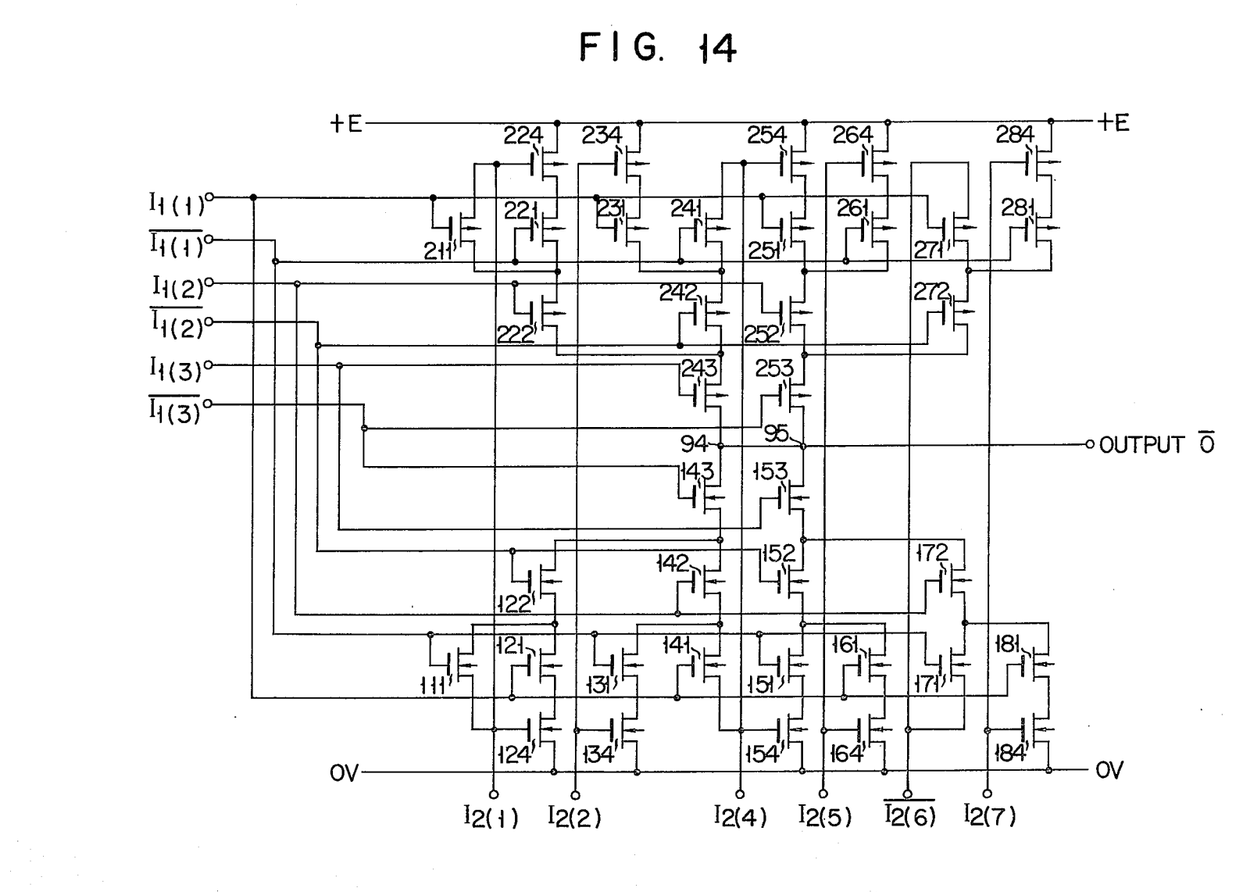
FIG. 14 sets forth a complementary MOS logic circuit according to a ninth embodiment of the invention, where IG-FET's are arranged in the same form as in FIGS. 11 and 13, and a second logic signal is supplied to the source end portions of a block series circuit and also to the gate end portions of the adjacent block series circuit corresponding to a signal complementary to said second logic signal.

There will now be described by reference to FIG. 14 a ninth embodiment of this invention. This ninth embodiment is a combination of the embodiment of FIG. 11 in which unnecessary ones of interchangeably usable IG-FET's are omitted and the embodiment of FIG. 13 in which second logic type signals are supplied to the source side of the respective block series circuits. Where the second logic signals $I_2(0)$ to $I_2(7)$ include those which are complementary to each other such as $I_2(0)$-$\overline{I_2(1)}$, $I_2(3)$-$\overline{I_2(4)}$, then the ninth embodiment of FIG. 14 enables only one component of such pairs to serve the purpose. With the ninth embodiment of FIG. 14, second logic signals $I_2(1)$, $I_2(4)$ are retained for use. These second logic signals are supplied to the sources of IG-FET's 111, 211, 141, 241 included in the bock series corresponding to second logic signals $I_2(0)$, $I_2(3)$, and also to the gates of IG-FET's 124, 224, 154, 254 included in the block series circuits corresponding to second logic signals $I_2(1)$, $I_2(4)$. Further, a complementary second logic signal $\overline{I_2(6)}$ is supplied to the sources of IG-FET's 171, 271 included in the corresponding block series circuit. Therefore, the gate input terminal and source input terminal of a block series circuit corresponding to each second logic signal can be combined.

Generally, an output signal derived from an input signal supplied to the source is conducted to the output terminal of a complementary MOS logic circuit with the same polarity as that with which said input signal was initially supplied to the source. Conversely, an output signal derived from an input signal supplied to the gate is conducted to the output terminal of the complementary MOS logic circuit with the opposite polarity to that with which said input signal was initially supplied to the gate. Since the source input terminal and gate input terminal of each block series circuit can be combined as described above, the arrangement of a complementary MOS logic circuit according to the ninth embodiment of FIG. 14 can be easily changed according to the polarity of an input signal. Since it is unnecessary to charge the polarity of an input signal before supplied to the complementary MOS logic circuit, there is no need to provide a separate device for changing said polarity, enabling the embodiment of FIG. 14 to be manufactured by simple process and a low cost.

The complementary MOS logic circuit of this invention can be practiced in various modifications. Where the second logic signals $I_2(0)$ to $I_2(7)$ consist of other forms of signals, each of the IG-FET's whose gates are supplied with said other forms of signals may be constituted by a plurality of IG-FET's. For example, where, in the embodiment of FIG. 4, the second logic $I_2(0)$ and other signals A, B have a relation $I_1(0) = A.B$, then a single N channel type IG-FET 114 may be formed of two series connected N channel type IG-FET's whose gates are supplied with the signal A and signal B respectively. Similaryl, a single P channel IG-FET 214 may be formed of two parrallel connected P channel IG-FET's whose gates are supplied with the signal A and signal B respectively Where an output $\overline{0}$ is sent forth from the logic circuit of FIG. 2 only when other logic signals $I_3(0)$ and $I_3(7)$ supplied to the complementary MOS logic circuit in addition to the first and second logic signals all have a logic level of ""1", then said other logic signals $I_3(0)$ to $I_3(7)$ are supplied to the eight AND gates AND1 to AND8 of FIG. 2 respectively. Or it is possible to replace the NOR circuit of FIG. 2 by and OR circuit and provide a NAND circuit supplied with said other logic signals $I_3(0)$ to $I_3(7)$ on the output side of said OR circuit. In this case, a plurality of N channel type IG-FET's whose gates are supplied with any of said other logic signals $I_3(0)$ to $I_3(7)$ are connected in series to the component series circuit of each block constituted by a plurality of N channel type FET's supplied with the first logic signals defining the state of logic combinations. The component seies circuit of each block constituted by a plurality of P channel type IG-FET's whose gates are supplied with any of said other logic signals $I_3(0)$ to $I_3(7)$ is connected between any of the output points 91 to 98 and the power supply line +E.

Where, in FIG. 2, said other logic signals $I_3(0)$ to $I_3(7)$ all have a logic level of "1", an OR circuit supplied with said other logic signals $I_3(0)$ to $I_3(7)$ is provided in addition to the NOR circuit of FIG. 2 in order to enable an output $\overline{O}$ from the complementary MOS logic circuit to have a logic level of "0" unconditionally. In this case, the component series circuit of each block constituted by P channel type IG-FET's whose gates are supplied with said other logic signals $I_3(0)$ to $I_3(7)$ is connected in series to the component series circuit of said block constituted by P channel type IG-FET's whose gates are supplied with first logic signals specifying the logic combinations. The component series circuit of each block constituted by N channel type IG-FET's whose gates are supplied with said other logic signals $I_3(0)$ to $I_3(7)$ is connected between the ground OV and any of the output points 91 to 98.

What is claimed is:

1. A complementary MOS logic circuit for obtaining second logic signals corresponding to the state of logic combinations specified by N first logic signals wherein N is greater than 2 which logic circuit comprises a plurality of block series circuits each consisting of a first component series circuit formed of series connected first channel type IG-FET's and a second component series circuit formed of series connected second channel type IG-FET's arranged complementary to said first channel type IG-FET's and having a common output terminal connected to all the component series circuits; said N first logic signals or those complementary thereto being selectively supplied to the gates of the first and second channel type IG-FET's to selectively conduct the second logic signals to the output terminal of the complementary MOS logic circuit through a predetermined component series circuit in response to said N first logic signals or those complementary thereto.

2. A complementary MOS logic circuit according to claim 1, wherein the first component series circuit of each block constituted by the first channel type IG-FET's and the second component series circuit of said block constituted by the second channel type IG-FET's are connected together in series to allow activation of a predetermined component series circuit for each state of logic combinations of said N first logic signals or those complementary thereto; the component series circuits of all the blocks are disposed between two power supply lines; and the gate of at least one of the first channel type IG-FET's constituting a component series circuit or the gate of at least one of the second channel type IG-FET's of each block constituting a counterpart component series circuit is supplied with any of the second logic signals or a signal complementary thereto.

3. A complementary MOS logic circuit according to claim 1, where a first source electrode of the first channel type IG-FET on that end of the first component series circuit of each block which is disposed opposite to the output point of said first component series circuit and a second source electrode of the second channel type IG-FET on that end of the second component circuit of said block which is disposed opposite to the output point of said second component series circuit are supplied with a signal complementary to the second logic signal corresponding to each block.

4. A complementary MOS logic circuit according to claim 1, wherein when the second logic signals include complementary ones, one of said complementary signals is supplied to a source electrode constituting the end portion of each block series circuit and also to a gate electrode constituting the other block series circuit corresponding to a signal complementary to said one second logic signal.

5. A complementary MOS logic circuit according to claim 1, wherein the block series circuits are arranged between two power source lines and the first and second component series are simplified by replacing two IG-FET's of the same channel type having the sources or the drains connected to the same power source line and the gates supplied with the same input signals by a single IG-FET.

6. A complementary MOS logic circuit according to claim 5, wherein the number IG-FET's connected to the same power source line is maximized and the IG-FET's connected to the output terminal is minimized, and each block series circuit comprises the same number of the first and second channel type IG-FET's.

7. A complementary MOS logic circuit according to claim 1, wherein two IG-FET's of the same channel type having gates supplied with the second logic signals are replaced by a single IG-FET where two second logic signals are common to each other and the component series circuits comprising said two IG-FET's are connected by using the single IG-FET replacing said two IG-FET's.

8. A complementary MOS logic circuit according to claim 1, wherein some of the second logic signals are constantly set at a predetermined logic level, and the IG-FET of each component series circuit having a gate supplied with said constantly set second logic signals of predetermined logic level is omitted in correspondence to the predetermined logic level.

* * * * *